US012704888B2

(12) United States Patent
Duchesne et al.

(10) Patent No.: US 12,704,888 B2
(45) Date of Patent: Aug. 11, 2026

(54) WATER HEATERS WITH COMPUTING ELEMENTS AS A NETWORK

(71) Applicant: 9346-6621 QUÉBEC INC., Québec (CA)

(72) Inventors: Simon Duchesne, Québec (CA); Dominique Duchesne, Saint-Armand (CA)

(*) Notice: Subject to any disclaimer, the term of this patent is extended or adjusted under 35 U.S.C. 154(b) by 1159 days.

(21) Appl. No.: 17/609,148

(22) PCT Filed: May 6, 2020

(86) PCT No.: PCT/CA2020/050607
§ 371 (c)(1),
(2) Date: Nov. 5, 2021

(87) PCT Pub. No.: WO2020/223808
PCT Pub. Date: Nov. 12, 2020

(65) Prior Publication Data

US 2022/0214727 A1 Jul. 7, 2022

Related U.S. Application Data

(60) Provisional application No. 62/843,632, filed on May 6, 2019.

(51) Int. Cl.
*G06F 1/20* (2006.01)
*F24H 1/20* (2022.01)
(Continued)

(52) U.S. Cl.
CPC ............... *G06F 1/20* (2013.01); *F24H 1/201* (2013.01); *F24H 9/2021* (2013.01);
(Continued)

(58) Field of Classification Search
CPC ... G06F 1/20; F24H 1/201; F24H 1/20; F24H 15/172; F24H 15/414; F24D 17/001;
(Continued)

(56) References Cited

U.S. PATENT DOCUMENTS 4,531,572 A * 7/1985 Molitor ............... A47L 15/4291 134/107
10,123,463 B2 11/2018 Best et al.
(Continued)

FOREIGN PATENT DOCUMENTS

CN 207907475 U 9/2018
DE 102009038669 A1 5/2010
(Continued)

OTHER PUBLICATIONS

International application No. PCT/CA2020/050607 International Search Report dated Aug. 19, 2020.
(Continued)

*Primary Examiner* — Topaz L. Elliott
*Assistant Examiner* — Daniel Ward Hatten
(74) *Attorney, Agent, or Firm* — Anglehart et al.

(57) ABSTRACT

An electric water heater with a computing device used to heat water from a residential or industrial water tank while executing useful computational tasks for a network. It includes a water tank, a heat exchanger, a computing device, a connectivity system to connect the computing device to a network, the network supplying computing tasks to the computing device, such that running the computing tasks results in a heat production, and a temperature control system to control the heat production from the computing device responsive to the water and heat exchanging fluid temperatures. The computational tasks are defined by one or more network user.

19 Claims, 12 Drawing Sheets

(51) Int. Cl.
*F24H 9/20* (2022.01)
*F24H 15/172* (2022.01)
*H05K 7/20* (2006.01)
*G16Y 10/80* (2020.01)

(52) U.S. Cl.
CPC ....... *F24H 15/172* (2022.01); *H05K 7/20236* (2013.01); *H05K 7/20263* (2013.01); *G16Y 10/80* (2020.01)

(58) Field of Classification Search
CPC ..... F24D 17/02; H05K 7/20763; Y02B 30/52; Y02B 30/18
USPC ..... 700/300, 295, 277, 282, 291; 702/62, 60
See application file for complete search history.

(56) References Cited

U.S. PATENT DOCUMENTS

| | | | | |
|---|---|---|---|---|
| 2012/0158190 | A1* | 6/2012 | Belady | G05B 15/02<br>700/282 |
| 2012/0222631 | A1* | 9/2012 | Lesage | F24H 1/202<br>122/18.1 |
| 2015/0226452 | A1* | 8/2015 | Adobati | F24H 9/0021<br>392/485 |
| 2016/0123620 | A1* | 5/2016 | Orsini | G05B 15/02<br>700/276 |
| 2016/0222830 | A1* | 8/2016 | Aga | F01K 23/04 |
| 2018/0231258 | A1* | 8/2018 | Armstrong | F24H 9/2021 |
| 2019/0285314 | A1* | 9/2019 | Shaffer | F28D 20/0039 |
| 2020/0355394 | A1* | 11/2020 | Karamanos | F28F 27/02 |
| 2021/0041143 | A1* | 2/2021 | Diederiks | F24D 17/02 |

FOREIGN PATENT DOCUMENTS

| | | | |
|---|---|---|---|
| FR | 3015645 | A1 | 6/2015 |
| FR | 3034851 | A1 * | 10/2016 |
| WO | 2010/019517 | A1 | 2/2010 |

OTHER PUBLICATIONS

International application No. PCT/CA2020/050607 Search Strategy dated Aug. 19, 2020.

International application No. PCT/CA2020/050607 Written Opinion of the International Searching Authority dated Aug. 19, 2020.

Wahlroos et al., Utilizing data center waste heat in district heating—Impacts on energy efficiency and prospects for low-temperature district heating networks. Energy. vol. 140, Part 1, Dec. 1, 2017, pp. 1228-1238.

Whitehead et al., Assessing the environmental impact of data centres part 1: Background, energy use and metrics. Building and Environment. vol. 82, Dec. 2014, pp. 151-159.

Whitehead et al., Remote sensing of the environment with small unmanned aircraft systems (UASs), part 1: a review of progress and challenges. Journal of Unmanned Vehicle Systems. Published Jul. 30, 2014. vol. 2; Iss. 3. Pahges 69-85.

Corresponding European patent application No. 20801554.5 extended search report dated Mar. 14, 2023.

Corresponding Candian patent application No. 3,139,331 extended search report dated Jan. 24, 2023.

European application No. 24202085.7 extended European search report dated Dec. 2, 2024.

European application No. 20801554.5 Communication about intention to grant a European patent dated May 31, 2024.

Canadian application No. 3,139,331 Notice of Allowance dated Jun. 19, 2024.

Corresponding Candian patent application No. 3,139,331 Examination report dated Sep. 9, 2023.

Corresponding Australian patent application No. 2020268220 examination report dated Mar. 27, 2025.

* cited by examiner

WATER HEATERS WITH COMPUTING ELEMENTS AS A NETWORK

CROSS-REFERENCE TO RELATED APPLICATIONS

The present patent application claims priority from U.S. provisional patent application No. 62/843,632 filed on May 6, 2019, the contents of which are hereby incorporated by reference.

TECHNICAL FIELD

The present disclosure relates to both a network of water heaters and computing element cooling. More particularly, the present disclosure relates to modules for liquid direct cooling of electronic components of computer devices, embedded in water heaters to generate hot water as a commodity, and controlled together as a network based on local, network-wide, as well as geographical demand.

BACKGROUND

Computational power is more than ever required for a multitude of tasks: big data analysis, complex computer simulations, complex encryption and decryption of sensitive data, blockchain computations, special effect rendering, research, etc. All these tasks result in significant power consumption from the vast array of computing devices running those tasks, which in turn ends up producing a lot of waste heat.

Data centers, which may house hundreds or thousands of computing devices, or computer clusters and computer grids are being built and assembled everywhere in the world to supply enough computational power to meet the ever increasing demand. These industrial applications have a heavy environmental footprint.

Further, the growth of connected sensors and objects (the “Internet of Things” or IoT) has placed a further demand on processing. Issues of data security and privacy, alongside bottlenecks in connectivity make processing data at the “edge”, i.e. close to where sensors and objects are located, an increasingly efficient way of delivering computing services.

This invention addresses both the environmental footprint as well as the need for edge computing.

Regarding the former, a growing number of data centers and an increase in their efficiency have been seen in recent years, as demand rises (Wahlroos et al., 2017). According to recent data, U.S. data centers use more than 90 billion kilowatt-hours of electricity a year, which requires the output of approximately 34 large (500-megawatt) coal-powered plants. On a wider scale, it was estimated that data centers globally used more than 416 terawatts in 2016, which was nearly 40% more than the entire United Kingdom for that same period. This is a significant amount of energy that is being devoted to this unique activity—and most of that power is expelled as warm air.

Over the past 10 years, data center power usage effectiveness (PUE), the ratio of total power required to run an entire facility versus the direct power involved in compute and storage, has decreased. Reducing these operating costs matters tremendously to data center operators, as any decrease in operational costs can translate into increased profitability. Companies such as Alphabet Inc. and its subsidiaries, that owns and maintains its own data centers, have achieved a PUE of 1.12, including all sources of overhead, which is very close to the theoretically perfect PUE of 1.0. Reducing PUE would be a significant achievement, as the impact on operators, society and the environment would be felt near immediately.

To achieve these energy savings, data centers have tended to use highly compact architectures, increasing the amount of units per facility square foot. That being said, while concentrated data centers are well suited to a number of tasks, the overall computing demand is varied, and a significant portion could be answered using alternative configurations. As such, there has been development for solutions consisting of computer grids or computer clusters, representing the pooling of computational resources between multiple premises and sharing the resulting computational power to tackle tasks that individually each of the computational resource would be unable to handle, or solve, or would take too long.

The individual elements of the computer grids or clusters still consume an equivalent energy as the data centers and farms, but the fact that they are spread in different premises allows for clever harvesting of the heat produced by the computing devices. By harvesting the waste heat and using it inside another system that generally uses the same amount of electricity to heat something, the environmental impact of the excess demand in energy for the computational tasks would become nullified.

Many households or industrial applications could benefit from this harvested heat, such as air or water heating. Regarding the latter, according to Energuide, the average North American household requires more than 25 gallons of hot water in the first hour of the household’s day and an average of 60 gallons of hot water a day. The heating of water, when adding every household and industry in an area, thus typically uses a significant amount of electricity without producing anything else than hot water, resulting in a non-negligible environmental impact (which is even higher in places using energy produced from high-carbon emitting sources such as coal plants).

Water heating is particularly interesting for harvesting heat produced by electronic devices, as liquid cooling is a very efficient type of cooling for computers and the cold water inlet to a water heater is at a good temperature to extract a significant amount of heat produced by computing devices.

Placing significant computing capacity in every household also answers the need for edge computing. It permits the processing of data as close as possible to home-based IoT and allows for privacy and security configurations that were hitherto impossible to achieve. Given significant wired and wireless connectivity, it further allows neighborhood-wide access to edge computing as well, decentralizing and offloading a significant portion of the demand unto a completely new network capacity.

SUMMARY

Applicant has found that matching a time period that a component operates proportionate to the hot water demand of a residence, for a computing device embedded directly inside a hot water tank, allowed to supply a household with the necessary daily hot water while performing computing tasks.

By improving the energy efficacy of both the computer and the water heater, computations could have a reduced carbon footprint. Indeed, it was estimated in 2012 that the growth of greenhouse gas emissions from the Information, Communication and Technology industry will rise quicker that the global footprint (Whitehead et al., 2014). Almost all electricity inputted into a data center is converted to heat and is not used (Wahlroos et al., 2017).

The present disclosure gives an availability proportionate to the heating demand of the residence, where availability refers to the time period that a component operates (Whitehead et al., 2014).

Furthermore, since the components are not operating at all time at the same level, tasks are spread through a network of units, sharing a load that is realistic and attainable against the total computing demand on the network. The addition of server-equipped water tanks in the network of unit, such as a computer cluster or grid, allows the load to be shared and completed even if some units are turned off or have a failure for a certain period of time.

Additionally, Applicant has found that having significant computing resources in the form of enterprise-grade servers in the domestic environment allows for computing at the very edge of the network. Wired and wireless access to these servers also allow for neighborhood-wide capacity.

Applicant has also found that, although air-cooling may be used, the use of liquid direct cooling is optimal. Liquid direct cooling may be described as the immersion of the electronic components in a dielectric fluid, wherein the heat from the electronic is transferred directly to the fluid by convection. Among liquid direct cooling system, those that are submerged provide an even temperature condition over the electronic components, which minimize operational issues.

Applicant proposes a novel device that combines a liquid direct cooling system for computing servers to a water heater, which may be a residential or industrial water heater. This has the advantage of merging two large sources of existing energy consumption into two value-added outputs. The first is from data centers, aiming to produce functional output from electrically powered servers but generating useless heat; and residential dwellers, aiming to produce warm water from electrically powered heaters but generating no useful other output. When deployed at scale, the units can form a distributed edge data center architecture, which has several uses and high net electrical efficiency.

Applicant has designed a pumpless, liquid direct cooling system for computing servers that is then embedded in a water heater, which may be a residential or industrial water heater. The encapsulation of the server in a heat exchanger tank is maintained at normal atmospheric pressure. It may be filled with a food-safe dielectric liquid, which acts as a convection transfer medium for the heat of the computer to the outer metal skin, which then in turns heats the water of the external water tank. The water tank, which may be an electric or gas water tank, has a shape able to withstand the pressure required by the applicable standards. It is made of metal with high resistance to corrosion. The pressurized water tank is externally insulated and covered with an outer metal skin.

Thus, the heat produced by the computing servers is directly transferred to the water tank. In a regular electric heater, there are upper and lower electric elements. In an embodiment, the upper electric element is replaced by our liquid direct cooling system enclosure. The embodiment further has all of the required thermostat controls, pressure controls and flushing valves, cold water inlet, and hot water outlet.

A broad aspect is a water heater, including a water tank with at least one water temperature gauge, one temperature sensor, a cold water inlet and a hot water outlet; a heat exchanger being one of: (a) a tank immersible in the water tank; (b) a tank bordering the water tank; and (c) a thermal coupler bordering the water tank, wherein the heat exchanger tank immersible in the water tank and the heat exchanger tank bordering the water tank are filled with a heat exchanging fluid and comprise at least one impervious connector pass-through and the heat exchanger comprises at least one heat exchanger temperature sensor; an insulating layer enclosing said water tank, wherein said insulating layer is adjacent to said heat exchanger; a computing device being one of: (a) immersible in the heat exchanger tank immersible in the water tank or bordering the water tank; and (b) coupled to the thermal coupler, wherein the computing device comprises a processor for processing computing tasks; and a connectivity system to connect the computing device to a network, the network supplying the computing tasks to the computing device such that running the computing tasks results in a heat production.

In some embodiments, the heat exchanger is a tank immersible in the water tank and the computing device is immersible in the tank immersible in the water tank.

In some embodiments, the heat exchanger is a tank bordering the water tank and the computing device is immersible in the tank bordering the water tank.

In some embodiments, the heat exchanger is a thermal coupler bordering the water tank and the computing device is coupled to the thermal coupler.

In some embodiments, the heat exchanger further includes a temperature controller to control said heat production from said computing device responsive to at least one of a water temperature reading from said at least one water temperature sensor and a heat exchanger temperature reading from said at least one heat exchanger temperature sensor, said temperature controller comprising at least one of: (a) a temperature relay sending to said network said water temperature reading and said heat exchanger temperature reading; (b) a control signal generator sending to said processor a task processing control signal; and (c) a software that maximizes the use of the computer system to warm water and minimizes the use of the other electric heating elements, in order to maximize computations and minimize energy demand. This software may be intelligent, in that it would take into consideration internal data (e.g. status of computers, current temperature and pressure, input water temperature), external data (e.g. external temperature and weather predictions) and usage patterns (e.g. household profile, household demand, calendaring).

In some embodiments, the heat exchanger tank immersible in the water tank or heat exchanger tank bordering the water tank further includes a heat exchanging fluid pressure sensor and a pressure and volume controller to control a pressure and a volume of the heat exchanging fluid in the heat exchanger by controlling at least one of a temperature of the heat exchanging fluid or a volume of the heat exchanger.

In some embodiments, the heat exchanging fluid is air.

In some embodiments, there is at least one fan to produce an air circulation inside the heat exchanger.

In some embodiments, the heat exchanging fluid is a dielectric cooling liquid.

In some embodiments, the dielectric cooling liquid is mineral oil.

In some embodiments, the thermal coupler is a thermal adhesive.

In some embodiments, the water tank further includes at least one water pressure sensor, the temperature controller being operable to control an internal water pressure of the water tank.

In some embodiments, there is a security lock system to prevent unauthorized access to the computing device.

In some embodiments, the heat exchanger tank immersible in the water tank further comprises a plurality of fins on an outer surface, the outer surface being in contact with water from the water tank.

In some embodiments, the cold water inlet from the water tank feeds cold water to a serpentine cold water pipe in contact with the heat exchanger.

In some embodiments, the hot water outlet further comprises a mixing valve connected to the cold water inlet, the mixing valve being controlled by the temperature controller to add cold water to the hot water outlet to obtain a desired output temperature.

In some embodiments, there is at least one heating element inside the water tank.

In some embodiments, the heating element is controlled by temperature controller to further produce heat when the computing device is unable to produce sufficient heat to keep the hot water between a low temperature threshold and a high temperature threshold.

In some embodiments, the hot water outlet from the water tank is connected to a second water tank, the water tank being used as a preheater for the second water tank.

Another broad aspect is a system including a network; a plurality of water heaters, each water heater from the plurality of water heaters being connected to the network through the connectivity system; one or more user computing devices connected to the network and receiving computational results defined by a plurality of computational tasks performed by the plurality of water heaters; a network task controller assigning computational tasks to the plurality of water heaters; and a network control interface, whereby users of the network submit computational tasks to be assigned to the plurality of water heaters.

In some embodiments, each of the connectivity system is operable to send a task request to the network when the water heater has a heat demand.

In some embodiments, the system further includes an external third party user connected to the network, wherein a result of the at least one computational task from the plurality of computational tasks is communicated directly to the external third party user.

In some embodiments, the network task controller is operable to assign the computational tasks to a specific water heater of the plurality of water heaters.

In some embodiments, the network task controller is in communication with a temperature controller of the specific water heater to determine control parameters.

In some embodiments, the network task controller is in communication with the computing device of the specific water heater to assign a distributed task.

In some embodiments, the network task controller is operable to assign the computational tasks based on availability determined by a demand in heated water.

In some embodiments, the network task controller is operable to predict a demand in heated water through a predictive algorithm.

In some embodiments, the predictive algorithm uses at least one of a water heating data internal to the household of a water heater and a data set of data external to said household.

In some embodiments, there is a network management software that may be intelligent, in that it would take into consideration network data (e.g. status of computers, type of tasks, computer capacity, computer type), usage patterns (e.g. time zones, individual unit household demand, geography) and match the external third party user tasks with the local request in hot water using a predictive algorithm.

In some embodiments, there is provided in combination an insulated hot water heater and computing device connectable to a computer network whose heat generated through operation is transferred to a water tank of the water heater through any suitable heat transfer mechanism, the water heater having a standby water temperature above about 50 degrees Celsius with a rate of heat loss to the ambient at room temperature (the rate of heat loss is defined mostly by the insulation and surface area of the tank) with said computing device supplying to the water tank heat at a rate matching the rate of heat loss. Depending on the design of the tank, the quality of the insulation and the standby temperature of the stored hot water in the tank, this rate of heat loss can be a suitable level of power consumption for a computing device of sufficient computational power, for example to contribute to a network of such computing devices providing data center capabilities. The water heater can be electric or gas combustion heated as the primary source of heat. To control the bacteria *Legionella,* the standby water temperature in the water tank can be at or above about 60 degrees Celsius, preferably above 70 degrees Celsius. The hot water tank can comprise internally or externally a mixer to mix tank water with cold water to provide hot water at a temperature that is not scalding to people, for example to be below 50 degrees Celsius.

BRIEF DESCRIPTION OF THE DRAWINGS

The invention will be better understood by way of the following detailed description of embodiments of the invention with reference to the appended drawings, in which.

DETAILED DESCRIPTION

Figure 1A:
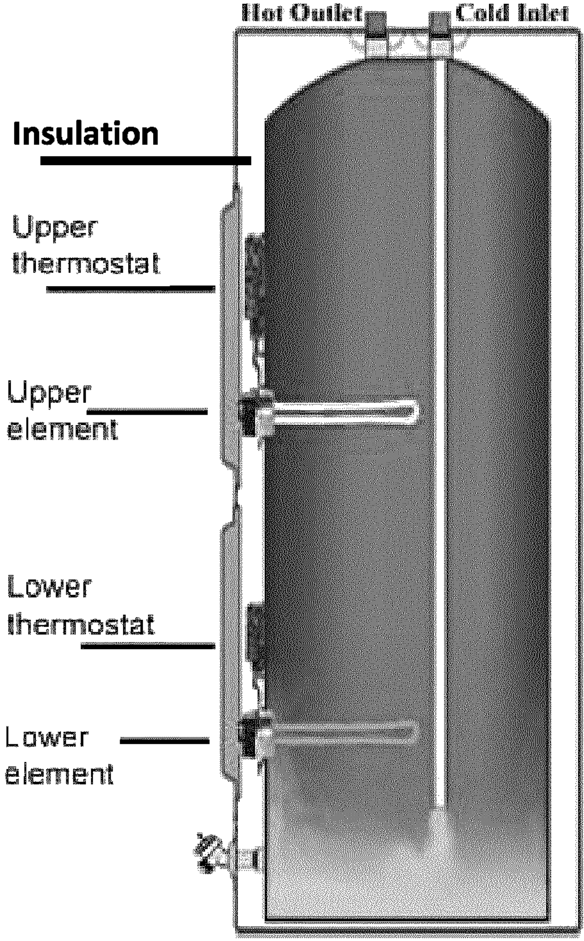
FIG. 1A is a prior art illustration of a standard electrical water tank.

The present disclosure relates to a network or networks of units, composed of pumpless modules for cooling electronic components of computer devices while generating hot water as a direct commodity. This provides residential, or industrial, hot water that is cheaper and act as alternative to energy consuming data centers that release excess heat into the environment.

Computer cooling is required to remove the waste heat produced by computer components, to keep components within permissible operating temperature limits. Components that are susceptible to temporary malfunction or permanent failure if overheated include integrated circuits such as central processing units (CPUs), chipset, graphics cards, and hard disk drives.

A cooling system's efficiency depends on the capacity of the heat generating component and its ability at transferring this heat. A direct cooling system removes the heat from components by direct contact of a medium with the component. Airflow is often used as a direct cooling technique. Use of heatsinks cooled by airflow reduces the temperature rise produced by a given amount of heat. Computer fans are widely used along with heatsink fans to reduce temperature by actively exhausting hot air.

An indirect cooling system would remove heat through a closed-loop medium, which would then be exchanged to an open-loop secondary system. Liquid cooling is often used in this way; heat is removed by contact with a liquid, which is then refrigerated by secondary cooling.

A computer device cooled by a liquid with great heat capacity and high dielectric affinity is preferred to an air-cooled method using fans that are at risk of breaking and dissipate heat less efficiently. A direct liquid cooling technology implies that the electronic device to be cooled is immersed in the liquid that carries the produced heat outwards, due to the convection motion that naturally happens inside the coolant reservoir.

The preferred embodiment of the present disclosure features a direct liquid cooling system. The dielectric liquid in which the computer server is immersed may have a higher boiling point than water; a great resistivity, good dielectric properties resulting in minimal power loss; a good viscosity and resistance to emulsification. These properties ensure optimal operations of the computing device.

The preferred embodiment includes a gastight chamber used as conventional water tank; a heat generating component, here a computing device; a pumpless, gastight heat exchanger, namely a heat exchanger that may be a tank immersible in the water tank, that act as a basin for the computer device, plunged in the conventional water tank; a dielectric heat transfer liquid, filling the heat exchanger, acting as a cooling medium for the computing device; a pressure and volume control system, namely a pressure and volume controller, for the dielectric liquid in the exchanger tank; a pressure control system, namely a pressure controller, for the water in the water tank; a temperature control system, namely a mandatory standard temperature gauge controlling a top and bottom temperature which may use a computerized temperature controller to control a temperature of the top, bottom and computer heating; a computer control system, namely a computer controller; a connectivity system; a security lock system; and an operating software.

When referring to a water tank, the main components of a standard water tank are considered. FIG. 1A illustrates an exemplary prior art configuration of a standard water tank which has a cold water inlet, a hot water outlet, an inner water tank surrounded by insulation, an outer wall, temperature sensors and control, and different heating elements (i.e. depending if the heater is electrical or gas).

The temperature of the water inside the hot water tank should be set at 60° C. According to a Quebec 2004 study, in order to avoid bacterial spread, i.e. a *Legionella* outbreak, the water has to be kept at a temperature above 49° C. (proliferation ranges between 32° C. and 45° C.). Since electric heaters are less propitious to scalding than gas or oil heaters, the temperature should be set at 60° C., which has a bactericidal (kill) effect. For households with small children, Canada Safety Council allows a lowering to 54° C. As for the outlet of the household, the temperature should never exceed 43° C.

The computing device being used to heat the water inside the hot water tank may thus execute computational tasks until the water temperature inside the hot water tank reaches a certain threshold. The threshold at which the computing device may stop executing tasks may be set around 60° C., or higher depending on variables such as the highest safe operation temperature for the electronic components of the computing device and the boiling point of the heat exchanging fluid.

In the preferred embodiment, the computing power of the computing device may be chosen such that continuous operation of the computing device is equal to the heat loss of the water tank and the household's hot water system. As such, the computing device may not have to stop executing computational tasks as the upper temperature threshold may never be reached by the heat generated by the computing device. Additionally, the computing device may not have to cycle through start-stop-standby modes and may therefore have lower failure rates.

During high hot water demand periods, heating elements may be used in parallel with the computing device. However, the system may control the heating elements to preemptively stop, such that the upper temperature threshold is not reached, and the computing device may continue to operate without stopping.

In order to supply hot water at a desired temperature to the household, the hot water outlet of the water tank may be connected to a mixing valve that allows a certain amount of cold water to be mixed to the hot water. The mixing valve may either be a thermostatic valve or a valve controlled by the temperature gauge.

The computing devices may be connected to a network from which they may access computational tasks to be executed in order for them to produce heat while solving useful computational requests for a user or a variety of users. The computing device may run tasks until the temperature of the water tank reaches the predefined temperature and then fall into a period of lower usage.

A period of lower output is experienced when the temperature of the tank has reached a set maximum. The system's reliability, meaning its ability to operate with risk of failure is auto-sufficient and troubleshooting is facilitated by easy access to the electrical components.

The Network and Computational Tasks

Figure 1B:
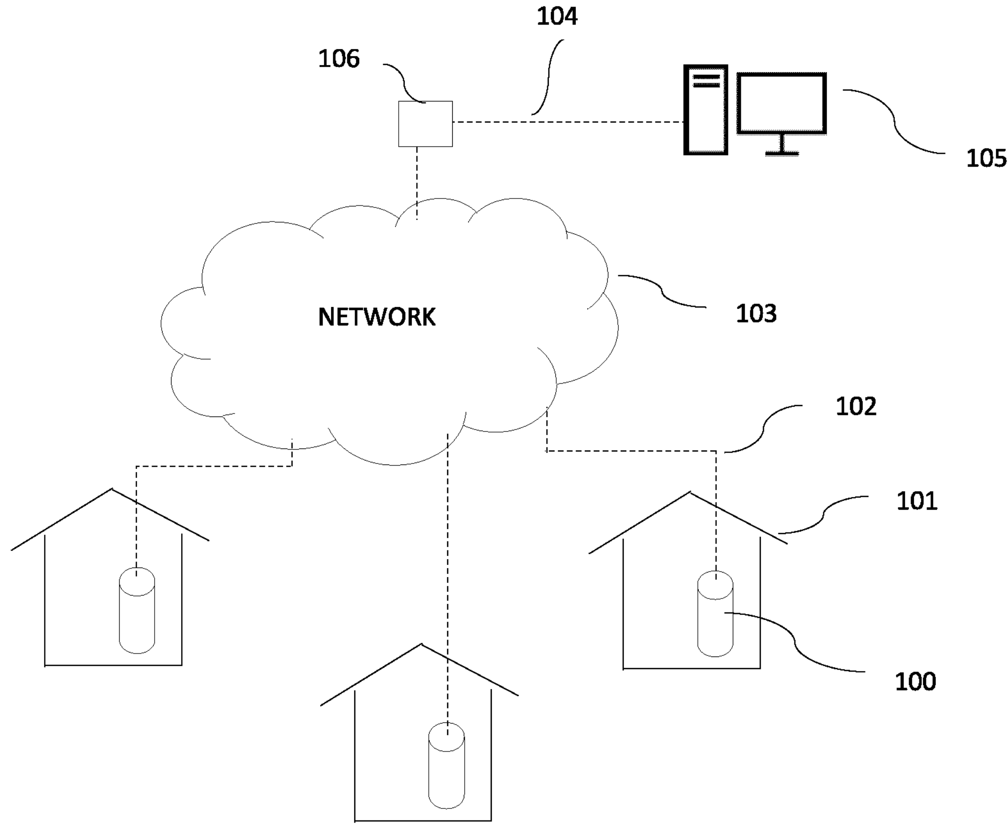
FIG. 1B is a schematic illustrating an exemplary network of residential premises having water heaters with computing elements and a user defining tasks to be executed by the network.

Reference is now made to FIG. 1B, presenting a schematic of an exemplary network of residential premises having water heaters with computing elements and a user defining tasks to be executed by the network.

In the preferred embodiment, featured in FIG. 1B, a plurality of premises 101, which may be households or industrial buildings, each having at least one water heating tank 100 with a computing device, are connected to a network 103. The network 103 may be a closed network (e.g. intranet) or a public network (e.g. internet). The network 103 and the computing devices of the water tanks 100 may thus come together to form a computer grid or a computer cluster.

The connection 102 of the computing devices of the electric water heating tanks 100 to the network 103 may be done through any typical means of data communication to a network. A person skilled in the art will appreciate the implementation of a wired or wireless communication technology (e.g. combination of router, modem, wife, wires, etc.) between the network and the different elements of the system. Similar means of data communication may be implemented for the connection 104 between the network task controller 106 and the user 105, and for the link between the network task controller 106 and the network 103.

The network task controller 106 may be a device that controls the computational tasks that are defined by the user 105, namely through a network control interface, by communicating the computational tasks to the computing devices in each premise. The network task controller 106 may act as a workload distributor that may separate the computational tasks into a plurality of shares, which may be distributed to different computing devices in different premises. As such, the computational tasks may be ran in parallel and at the same time throughout a plurality of devices connected to the network 103. This effectively allows the reduction of the time required to completely execute a given computational task.

Moreover, load sharing may also ensure that computing devices that must stop calculations, because the temperature of the water tank has reached the desired threshold, does not entirely blocks the solving of the computational task. Similarly, failures of one or more computing device may not hinder the completion of a task. However, depending on the availability of the computing device resources, the computational tasks and their priority set up by a user 105 through the network control interface, the network task controller 106 may also provide a computing device with an undivided computational task.

The network task controller 106 may be a dedicated device, such as a dedicated computing device, or be incorporated inside another computing device (e.g. it may be included in a user station that may be used to control the computational task system). A preferred embodiment features the network task controller 106 as being software implemented and run in the non-transitory memory of a computing system that may be accessed by the user and that is operable to communicatively couple computational tasks and computing devices.

A software implementation of the network task controller 106 may be, for example, a program residing on non-transitory memory and being executable by a processing unit of a computing device or an application to be similarly used through a portable device (e.g. cellular phone, tablet, etc.). It will be appreciated that any other types of software implementations, such as through a web-based application, may be used to allow a user 105 to define computational tasks to be executed by the system.

The network task controller 106 further allows communication of the solution to the executed computational task. The communication may be done directly to the requesting user 105 or to a third party as defined by the requesting user 105. The network task controller 106 may also provide data packaging for the solution of the executed computational task if the task had been previously divided in multiple shares.

The user 105, or plurality of users, having administrative rights to the computing devices system through the network control interface, may define computational tasks to be run on the computing device grid. The computational tasks may be any computing tasks that typically require significant computational power. Examples of such tasks are: big data analysis, complex computer simulations, complex encryption and decryption of sensitive data, cryptocurrency mining, special effect rendering, research, etc.

Figure 10:
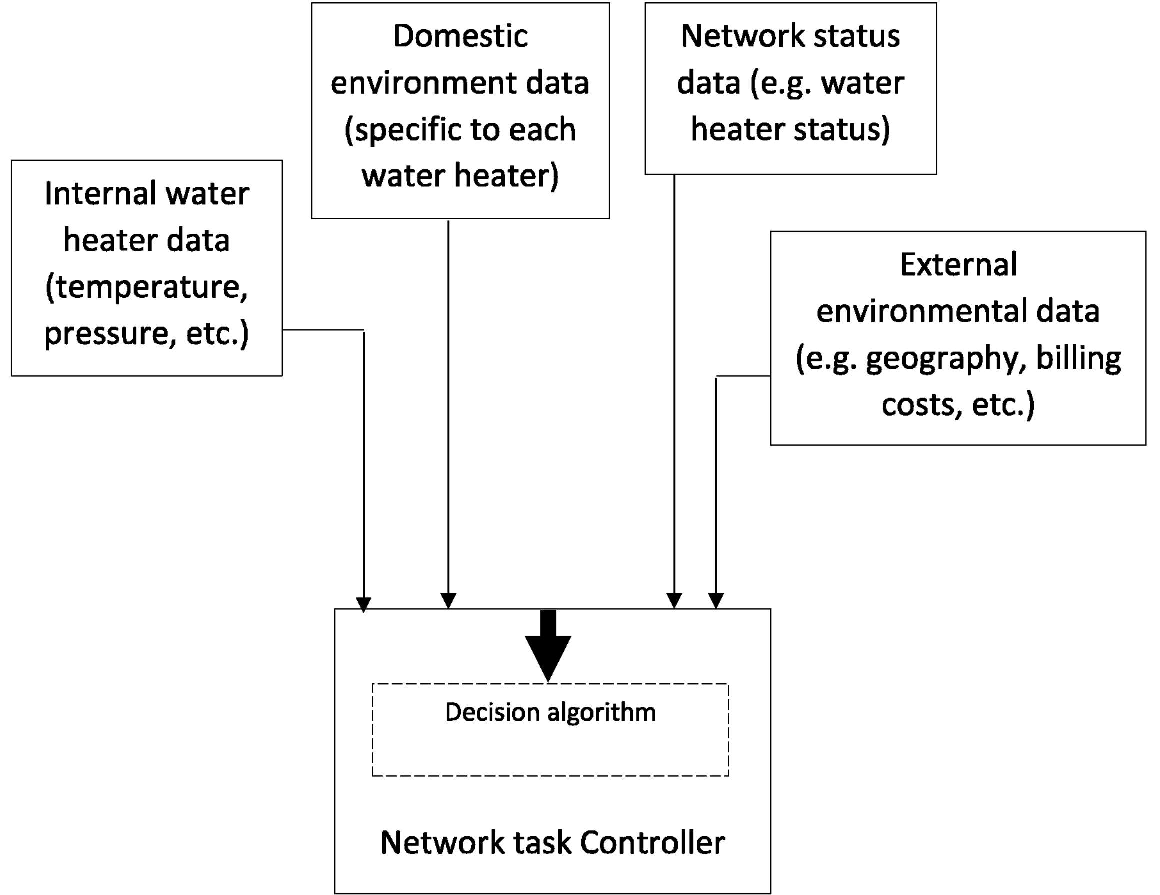
FIG. 10 is a representation of an exemplary set of inputs considered by the decision algorithm of the network task controller.

The availability of each computing unit to perform computing tasks will depend on a number of factors related to the household use of heated water. As such, the network task controller may incorporate algorithms, such as those from artificial intelligence, to assign tasks based on availability, planned availability, and statistical models of availability. An exemplary set of inputs to this decision algorithm is illustrated in FIG. 10. These may include information collected on household use of heated water (i.e. domestic environmental data); meteorological forecasts, calendar forecasts, billing costs per period of electricity usage (i.e. external environmental data). It may also further include information on the status of each water heater with regards to availability, planned availability, statistical availability, system malfunctions and task priority status (i.e. network status data), and other information of a similar nature that would increase the predictive ability of the algorithm. The network task controller may also consider the internal water heater data (e.g. temperature, pressure, etc.) in the decision algorithm to assign a task to a specific water heater. In some embodiments, the decision algorithm may be a predictive algorithm using machine learning and any other artificial intelligence processes.

The network task controller receives all the information from all the elements in the network and thereafter decides which unit may run a given task. The decision algorithm may consider the length of the task to be run and the amount of computing power required (e.g. not all computing devices in the network necessarily have the same computing power) before allocating the task to a water heater's computing device. The network task controller may further separate the task in sub-tasks to be run on different water heater's computing devices (concurrently or not). Additionally, the decision algorithm may consider the data exchange load on the network (transferring requests to the computing devices and receiving outputs) before assigning tasks.

The Water Tank and Heat Exchanger

Figure 2:
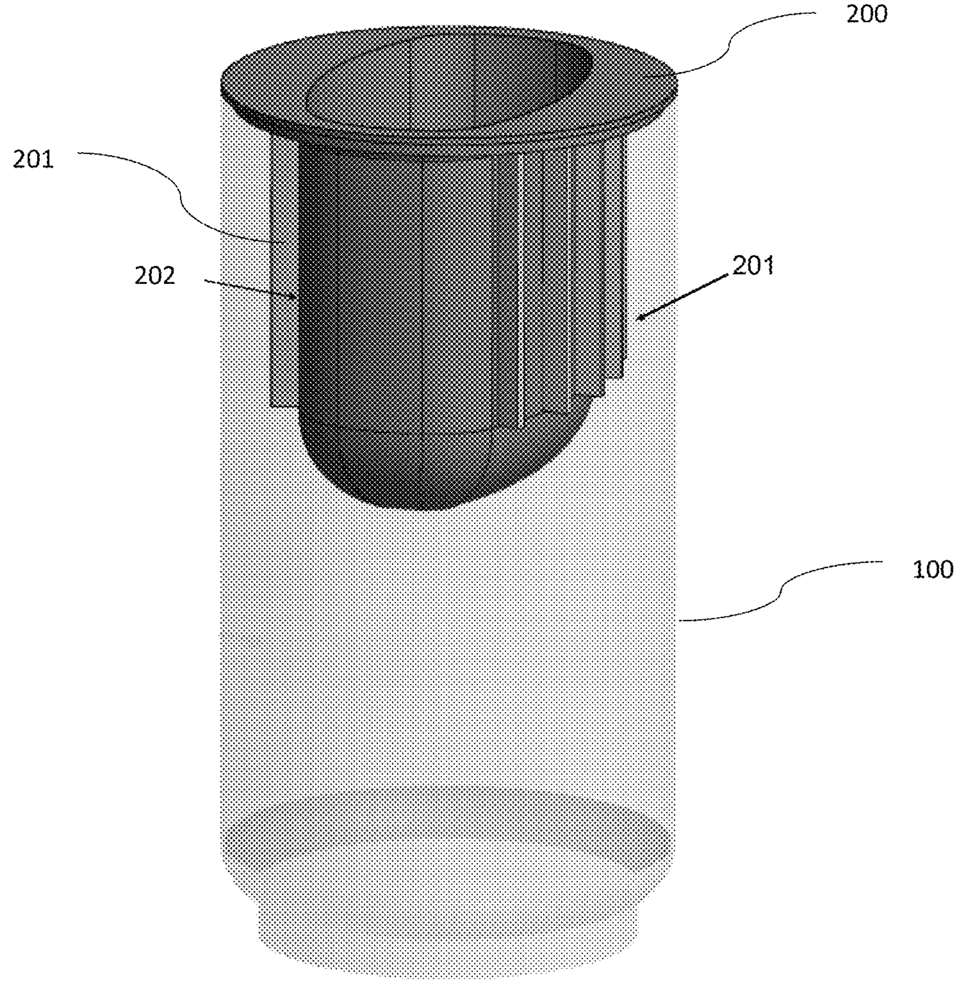
FIG. 2 is a representation of an exemplary hot water tank comprising an exemplary top-mounted heat exchanger with fins.

The electric water heater with computing devices may be implemented as a computing device residing inside a heat exchanger that may be a tank, which is further enclosed inside a water tank. Reference will now be made to FIG. 2, which is a representation of an exemplary hot water tank 100 comprising an exemplary top-mounted heat exchanger tank 202 with fins 201.

In order to cool the components of the computing devices, heat may be harvested by them being immersed in a cooling liquid or heat exchanger medium, surrounding the computer device and filling the heat exchanger tank 202, which may be a gastight chamber, at atmospheric pressure, having an interior volume sufficient to house the computing device and other such devices as demanded.

The heat exchanger tank 202 is embedded in a water tank 100, which may also be a gastight chamber, where water is maintained for residential or industrial hot water purposes. This secondary chamber may be at the pressure requested by relevant authorities through controls, as will be further defined herein. The heat exchanger tank 202 is so designed as to be able to withstand the water tank 100 pressure, even when there is no cooling liquid inside it.

In one embodiment, fins 201 are added to the outside of the heat exchanger tank, which may improve structural strength as well as increase the heat dissipation characteristics of the assembly.

In the preferred embodiment, the heat exchanger 202 is a top-mounted tank that resides in the upper portion of the water tank 100. As such, the heat exchanger may be directly joined to the top pressure cover 200 of the water tank 100. A top-mounted heat exchanger tank may be optimal for various reasons, such as ease of access to the computing element for maintenance and repairs, typical piping installation is done through the top portion of a water tank and when using liquid coolant inside the heat exchanger tank, liquid will not pour out when the access door is opened.

Other embodiments may feature a bottom-mounted heat exchanger, that may also be a tank with a side access door, which may be optimal for high-energy dissipating computing devices, as the natural convection of the water in the water tank tends to move hot water on top of colder water. The bottom-mounted heat exchanger tank may feature a sliding rack to support the computing device, which may allow the computing device to be completely slid out for maintenance. Another advantage of the bottom-mounted heat exchanger is that it may be built without a heat exchanging liquid, having the heat exchanger 202 bordering the water tank. Using air may be sufficient for this application as hot air necessarily ascends and thus comes into contact with the water tank. Moreover, the computing element may physically touch the water tank's wall such that heat transfer is optimized, or the computing element may have passive heat sinks (e.g. metal tube with fins) that are themselves in contact with the water tank's walls. As typical water tanks, as features in FIG. 1A, have limited insulation on the bottom portion of the water tank, using this configuration may not require much modifications to the normal structure of a water tank.

Figure 7A:
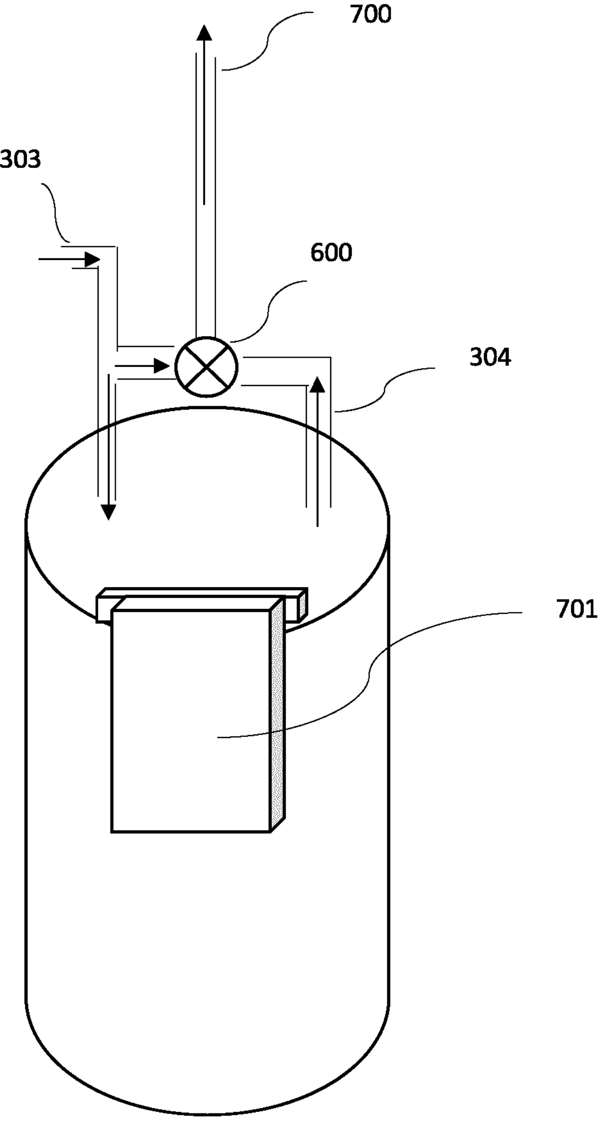
FIG. 7A is an illustration of an exemplary hot water tank with a mixing valve to control the temperature of the hot water output by mixing in cold water as necessary and an exemplary bordering heat exchanger fixed to the water tank's wall.

In yet another embodiment, the computing device may be a side-mounted device that attaches on the side of a water tank, as is shown in FIG. 7A. The computing device may then be in direct contact with the water tank's walls and may be incorporated in a removable attachable unit 701 or directly between the water tank's outer surface and inner wall, replacing part of the insulating layer. As the water tank has insulation, there may be some modifications required to remove parts of the insulation, such that the computing device becomes directly in contact with the inner wall of the water tank. Insulation may be further added between the computing device and the outer wall of the water tank, such that while the heat is dissipated towards the water inside the water tank, the outside surface of the outer wall may not become excessively hot. In such an embodiment, the heat exchanger may be a heat exchanger tank bordering the water tank.

Figure 7B:
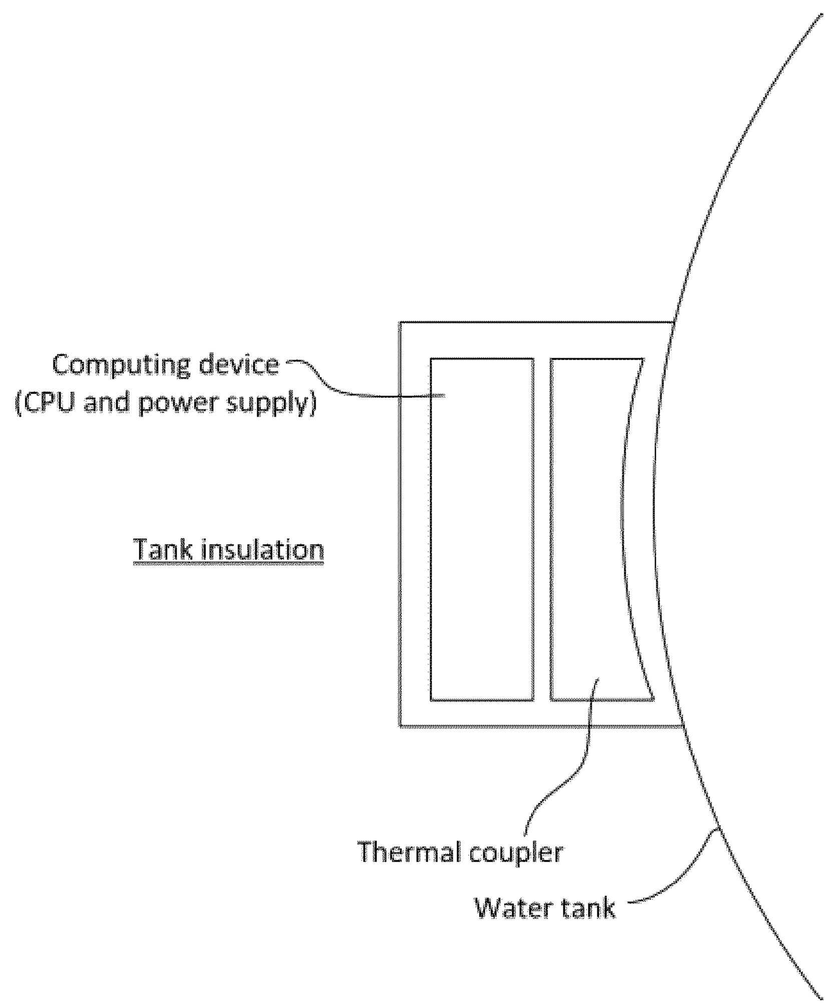
FIG. 7B is an illustration of an exemplary hot water tank with a thermally coupled computing device mounted on the sidewall of a water tank.

In yet other embodiments, such as the one illustrated in FIG. 7B, and in order to ease the installation of direct sidewall contact of computing devices without using a side-mounted tank, the computing devices may be directly thermally coupled to the water tank surface (e.g. using thermal adhesives). This type of embodiment therefore use thermal couplers as heat exchangers to directly transfer the heat from the computing device to the water tank sidewall, such that no heat exchanging fluid may be necessary. The thermal couplers may be thermal adhesives or any type of structural passive heatsink that may serve to fix the computing device to the curved wall of the water tank.

In such embodiments, the thermal coupler is the heat exchanger and it may be comprised inside a pocket (e.g. enclosure) inside the insulating layer surrounding the water tank, such that the computing element may be thermally insulated without any major structural modifications to the water tank. To maximize heat transfer to the water tank, the components of the computing device that dissipates most of the power (e.g. power component and CPU) may be located closest to the water tank sidewall. In such embodiments, the computing device may be connected to pass-through connections that allow cables to connect through the insulation layer.

In the embodiment of a removable attachable unit bordering the water tank 701, the heating system with the computing device may be directly useable on any conventional water heater with minimal structural changes, except to the insulation layer. This embodiment may use any type of coolant, whether it be direct cooling with the computing elements being disposed to contact the walls, passive heat sinks, air as the heat exchanging fluid or direct liquid cooling similar to the top-mounted embodiment.

Incorporation of the computing device between the inner and outer walls of the water tank would require side access doors to have access to the computing device in order to be able to perform maintenance. Moreover, direct liquid cooling may be incorporated with this type of embodiment where there is a heat exchanging liquid flushing mechanism, such that it becomes possible to remove all the liquid comprised between the water tank's inner and outer walls to allow access to the computing elements. Otherwise, direct contact of the computing device with the internal tank walls may be sufficient to transfer heat without requiring direct liquid cooling.

The preferred embodiment uses direct liquid cooling, such that the heat exchanger 202 is filled with a dielectric liquid that surrounds the computing device. The cooling liquid has high dielectric strength, high thermal stability on the range 0-100° C., and low toxicity such that it may be used without concerns for a leak in the potable water of the water tank. In one embodiment, the cooling liquid is mineral oil. In some embodiments, the cooling liquid is tainted with a visible color, which would serve to indicate a leak in the potable water being distributed in the household or industrial water system.

Heat is thus transferred from the computing device to the water of the water tank by conduction through the dielectric cooling liquid and due to natural convection inside the heat exchanger.

In other embodiments, air is used in place of a dielectric liquid. In such embodiments, the heat exchanger and its access door may feature one or more fans in order to obtain adequate ventilation airflow.

Figure 3:
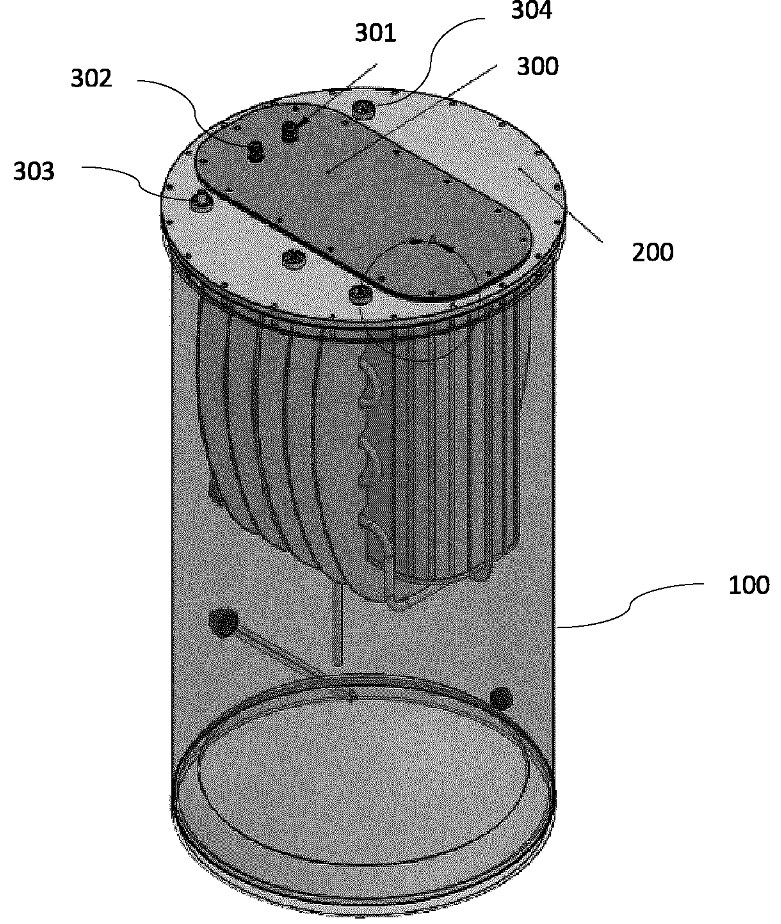
FIG. 3 is a representation of an exemplary hot water tank comprising an exemplary top-mounted heat exchanger with the computing element access door closed.

Reference will now be made to FIG. 3, which is a representation of an exemplary hot water tank 100 comprising an exemplary top-mounted heat exchanger 202 with the computing element access door 300 closed.

The heat exchanger 202 has a displaceable door 300 giving access to the computing device. The door may have sensors to detect intrusion into the heat exchanger 202, for both human safety and computer security. Operation of the device may stop upon unauthorized entry, depending on the safety settings of the system as defined by the user 105. The access door 300 may also have a security lock to prevent access to the computing elements inside the heat exchanger 202, thus both preventing the tampering of the devices by unauthorized parties while also preventing incidents that may happen with the presence of heated liquid coolant and an unauthorized party.

Power and network connections are provided to the computing device through the displaceable wall, namely the access door 300. As safety measures, additional sensors may be present to detect intrusion in the computing device; loss of pressure; temperature; and other measurements related to the good operation of the system.

All the power and network connection cables go through one or more impervious connectors 301, 302 that allows the cables to go through the access door 300 while preventing liquid and pressure leaks from the inside of the heat exchanger 202. For embodiments in which the heat exchanger is a thermal coupler, the connectors may not necessarily be impervious as the enclosure of the computing device may not be filled with a heat exchanging liquid. As such, cable pass-throughs may be provided to allow connection of the computing device through the insulation layer.

Other features of the water tank (e.g. cold water inlet 303, hot water outlet 304, insulation, inner and outer walls, etc.) and complete system are of general use in other residential or industrial water heaters, and/or requested by the appropriate standards and would be known to a person skilled in the art (an exemplary prior art illustration of typical water tanks is presented in FIG. 1A).

Figure 4:
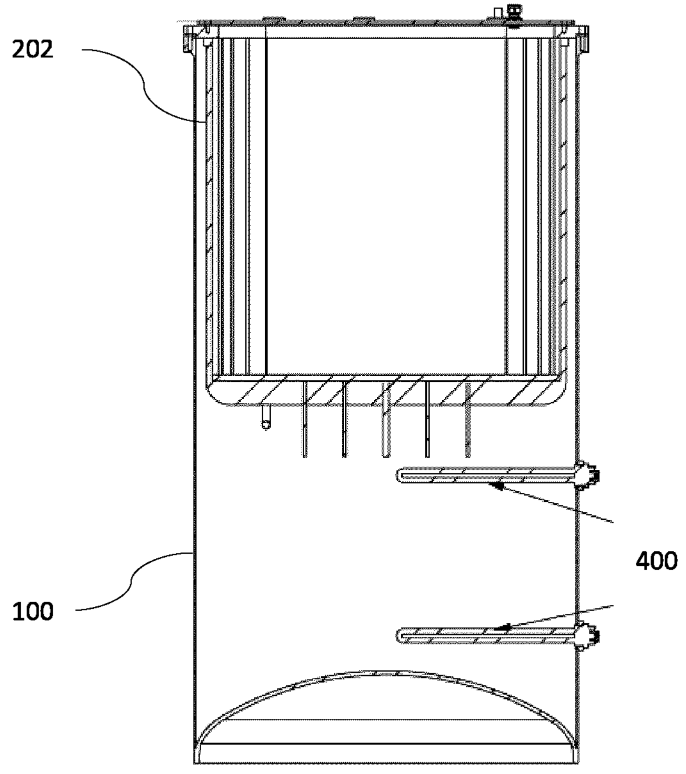
FIG. 4 is a side view of an exemplary hot water tank comprising an exemplary top-mounted heat exchanger and two electric heating elements.

Reference is now made to FIG. 4, which is a side view of an exemplary hot water tank comprising an exemplary top-mounted heat exchanger and two electric heating elements 400. The water tank may include heating elements, such as electric heating elements 400, in order to provide better coverage of hot water needs. As a matter of fact, depending on the volume of hot water contained in the water tank and a typical household or industrial usage of hot water, there may be intensive periods during the day where the hot water usage exceeds the heating capacity of the computing device.

Computing device used for heating water in the water tank may usually be sufficient for heating all of the water tank over a long period of time but may dissipate enough heat to properly and quickly heat cold water when the hot water tank is close to empty and still being in demand. Thus, adding heating elements 400, similar to the ones already incorporated in commercial water tanks, may provide the extra heating power required to avoid or diminish periods of hot water unavailability.

Figure 5:
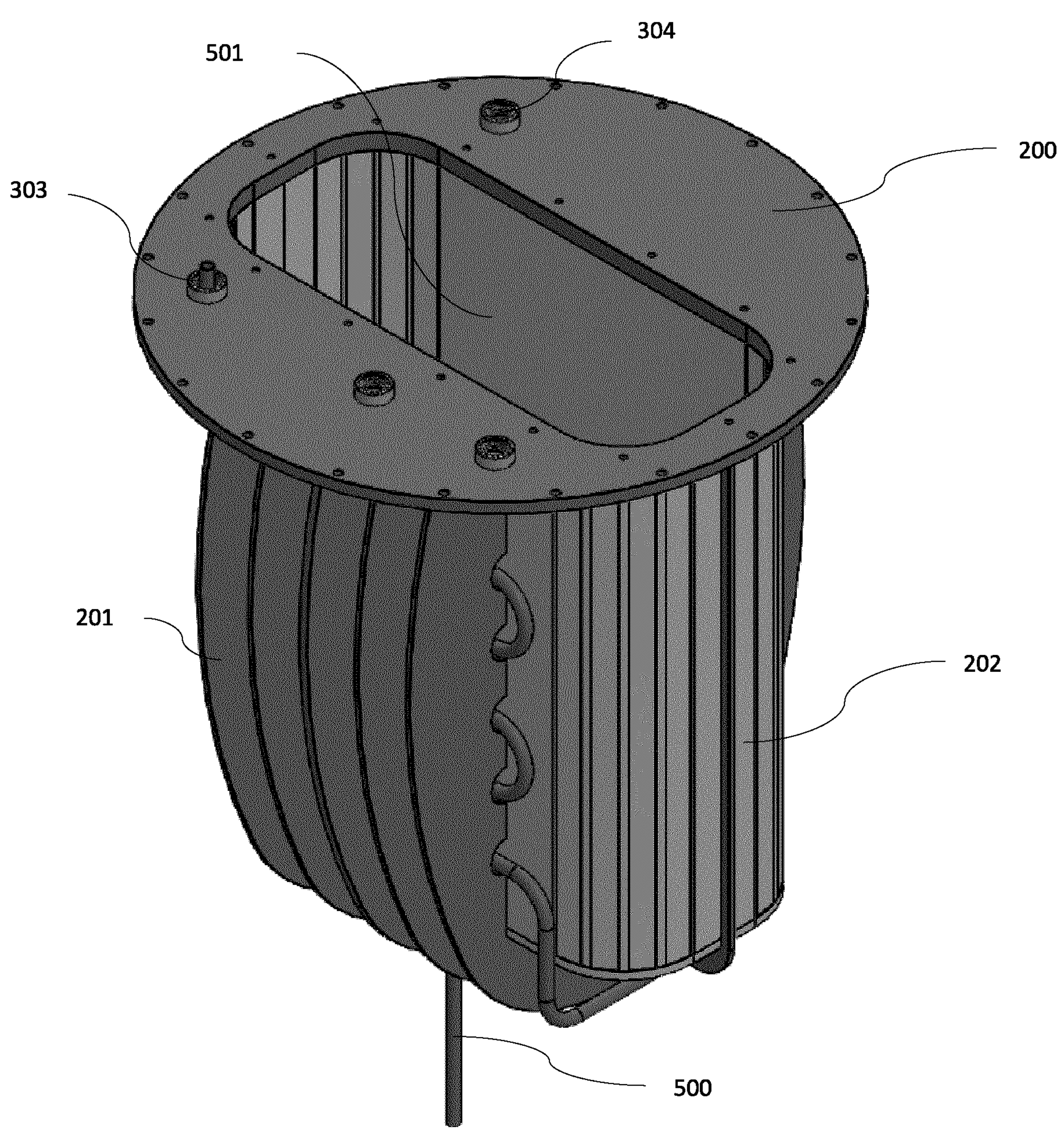
FIG. 5 is an isometric view of an exemplary heat exchanger with fins and a serpentine cold water tube.

FIG. 5 illustrates an exemplary heat exchanger that is a heat exchanging tank immersible in a water tank. The heat exchanger 202, features structural fins 201 and the joined top pressure cover 200. The cold water inlet 303 feeds cold water in a cold water pipe 500 which may be a serpentine tube going around the heat exchanger 202. This preferred embodiment ensures an optimal heat extraction from the heat exchanger walls 501. In other embodiments, the cold water pipe 500 may go directly from the cold water inlet 303 to the water tank.

Temperature Control

In order to meet regulatory requirements, a standardized hot water temperature gauge is used. This standardized temperature gauge provides an indication when the water from the water tank reach a low and high temperature. The low and high temperature thresholds may be set to temperatures ensuring that there will not be bacterial proliferation inside the hot water tank. The temperature gauge may thus provide the heating elements with the trigger to start or stop producing heat to keep the hot water temperature in the range between the low and high temperature threshold.

In addition to the temperature gauge, a computerized temperature controller may also be included in the system. This computerized temperature controller further regulates the temperature of the water inside the tank in order to reach the set value of temperature, but does so for the purpose of controlling the heat production of the computing device. It may also measure the temperature of the basin in order to stop computing if it reaches a limit, which the electronic devices cannot withstand. When the water tank reaches the set value, the computing changes and the temperature is maintained continuously. The task on the computer may be transferred to another unit in the network if the computing device is stopped or slowed to prevent overheating the water of the water tank.

Figure 6:
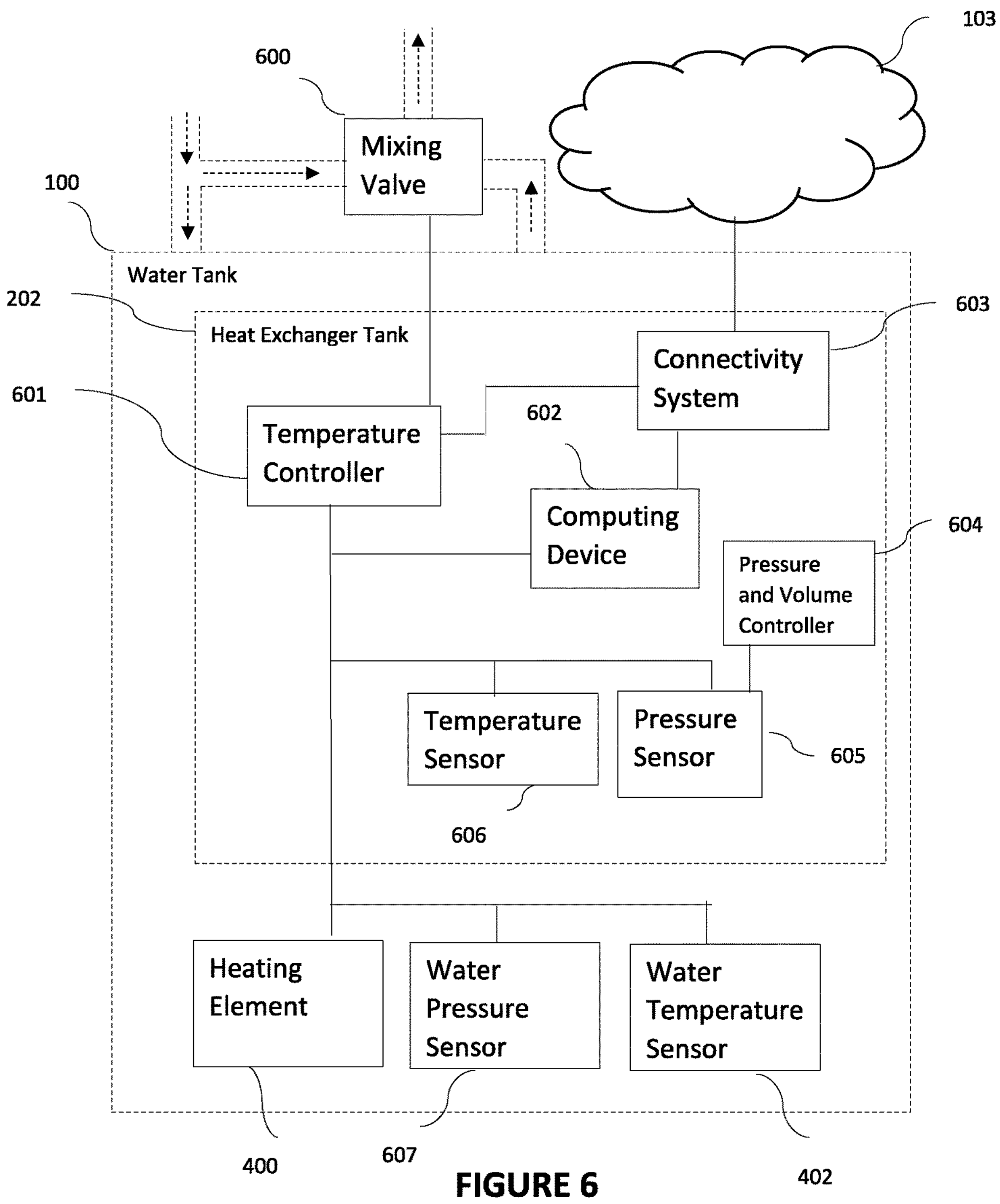
FIG. 6 is a schematic representing an exemplary electric water heater with a computing element with an exemplary set of systems and components.

Reference is now made to FIG. 6, which is a schematic representing an exemplary electric water heater with a computing element with an exemplary set of systems and components.

The water tank 100 may include heating elements 400, the heat exchanger 202 and a plurality of sensors, such as water pressure sensors 607 and water temperature sensors 402. The temperature sensors 402 are required for the calculations of the temperature control system 601, namely the temperature controller, and its control of the computing device 602 heat production along with the control of the heating element 400 if the water tank 100 is equipped with heating elements 400. The temperature controller may include a temperature relay to send temperature readings from both the water and the coolant to the connectivity system, such that the temperature controller may send and receive control inputs from the network. The temperature controller further includes a control signal generator in order to send a control signal to the computing element's processor, such that it may start or stop processing a computational task.

The water pressure sensors 607 may be required to meet the water tank 100 internal pressure regulatory requirements that are enforced in many countries. The temperature controller 601 may also base its heat production requirement calculations based on the water tank internal pressure and reduce the preset desired temperature by a certain amount if the internal pressure needs to be reduced or increase the temperature over the desired temperature if the internal pressure needs to be increased. This also depends on other factors, which may be factors such as a system defined maximum and minimum temperature that may not be exceeded, volume of the water inside the water tank, etc.

In the preferred embodiment, the heat exchanger 202 includes all of the temperature and connectivity systems that are required for the computing device to perform its tasks and to control the water temperature. This embodiment allows for maximum harvesting of the heat generated by the computing elements plus the heat generated by the different controllers and connection systems.

The computing device 602 is connected both to the temperature control system 601 and the connectivity system 603. The temperature controller 601 may issue commands to start or stop the computing device 602 depending on the heat required to have the water of the water tank 100 reach the desired temperature. The temperature controller 601 may also stop the computing device 602 if the temperature or pressure from the heat exchanger reaches a certain threshold temperature that, if exceeded, may cause the computing device components to exceed their maximum temperature ratings.

The temperature controller 601 thus also receives information from the heat exchanger temperature sensors 606 and pressure sensors 605. The pressure sensors 605 are further linked with a pressure and volume control system, namely the pressure and volume controller 604, which may act as a safety redundancy system to control the internal pressure and volume of the heat exchanger 202 when the heat exchanger is either a tank immersible in the water tank or a tank bordering the water tank.

The connectivity system 603 to which is linked the computing device 602, allows for the connection of the computing device with the network 103. The connectivity system 603 may thus be responsible for all data exchange between the computing device and an external user. As will be further described herein, the computing device 602 may request the connectivity system 603 to fetch a computational task on the network, such that it may operate as requested by the temperature control system 601.

Finally, the temperature controller 601 may be connected to a mixing valve 600, if the electric water heater is equipped with such. The mixing valve 600 may be an electromechanical valve that partially opens or closed based on the information sent by the temperature controller 601.

The mixing valve 600 and its operation is further illustrated at FIG. 7A. FIG. 7A shows the mixing valve 600 having two inputs, one from the cold water inlet 303 and another one from the hot water outlet 304, being the output of the hot water tank 100. The mixing valve 600 adds a quantity of cold water to the output of hot water in order to reach a desired temperature for the household or industrial use. The mixing valve 600 may be a thermostatic valve, thus not requiring any control command from the temperature controller 601. The valve may otherwise be any type of electromechanical valve that may receive an input from the temperature control system 601 in order to allow for varying household water output temperatures.

Figure 9:
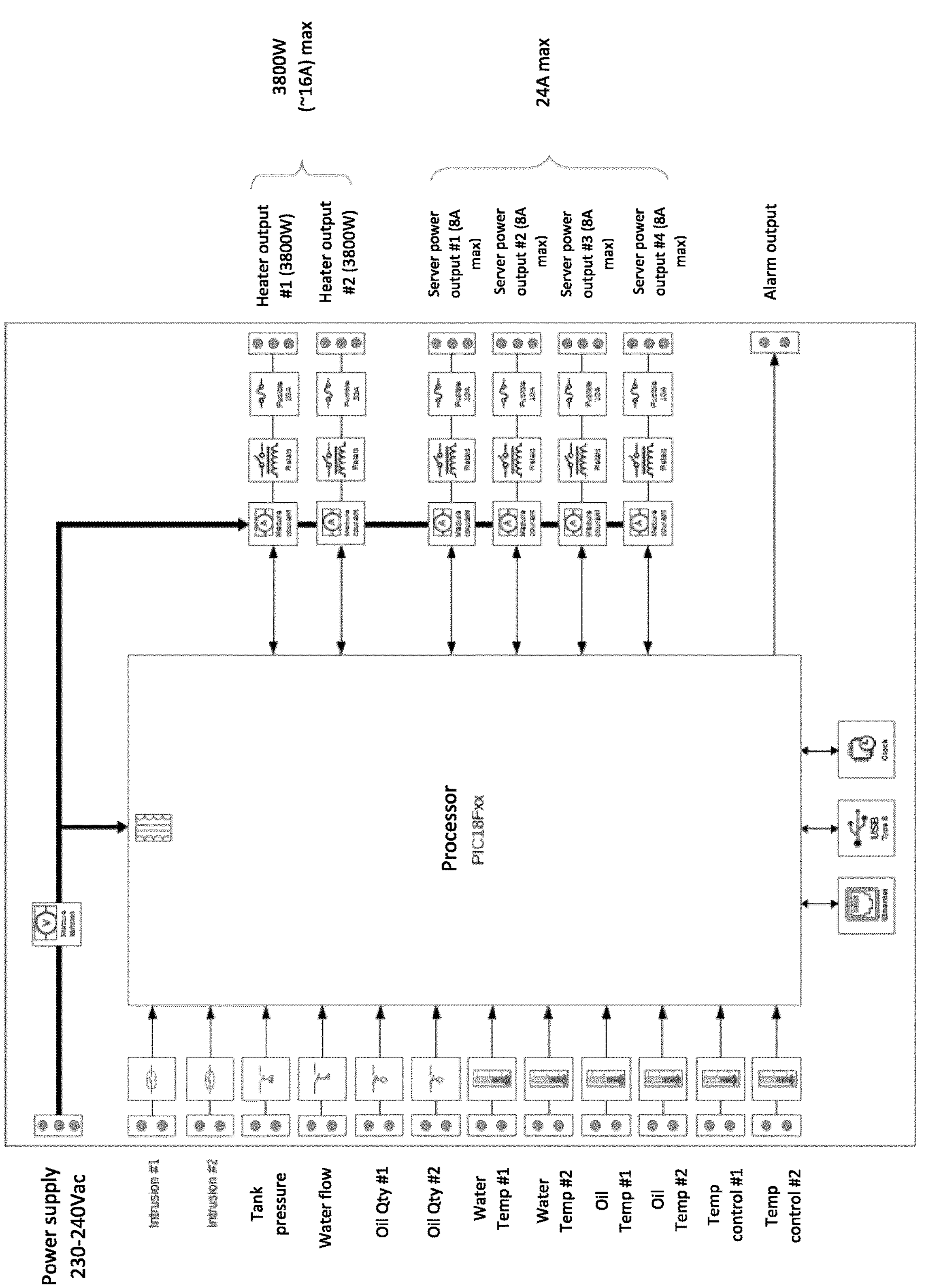
FIG. 9 is an exemplary temperature controller diagram illustrating an exemplary set of inputs and outputs to the temperature controller processor.

Reference is now made to FIG. 9, presenting a schematic of an exemplary temperature controller 601 with an exemplary set of inputs and outputs that are used by the temperature controller's processor. This embodiment features intrusion inputs from a security system installed on the access door 300, pressure and temperature readings from the water tank and the heat exchanging fluid and the water's flow. In this embodiment, the processor receives the temperature control from the water tank's thermostats. In other embodiments, the temperature control may be an output of the processor, based on the pressure and temperature readings received as inputs.

The embodiment of FIG. 9 further illustrates the outputs of the exemplary temperature controller 601. Outputs are provisioned for the control of heating elements that would complement the heat production of the computing device 602. Additionally, multiple outputs for servers are included, such that they may send control signals to the computing device 602 to start or stop the solving of a computational task, send signals to the connectivity system 603 and to other embedded systems. There is also an alarm output in order to control an alarm that would trigger if there were an unauthorized access to the system (e.g. an unauthorized person opening the security lock to unplug the computing device).

It will be understood by someone skilled in the art that the design of the system's architecture presented in FIG. 9 is but an example with a given set of inputs and outputs. Similar architectures may be done with any number of inputs and outputs depending on the specifics of a given water heater with a computing device design.

The Computing Device

The computing device is a combination of central processing units, graphical processing units, chipsets, memory modules, storage modules, control modules, and power supplies, arranged with connectivity boards. The computing device may comprise a plurality of one or more of the aforementioned components. The computing device may further consist of multiple computing devices connected to each other to provide additional computing power and heat production capabilities.

The computing device is located inside the heat exchanger when it is a tank or fixed to it if the heat exchanger is a thermal coupler. For heat exchanger tanks, they may be a gastight chamber, at atmospheric pressure, having an interior volume sufficient to house it and other such devices as required.

The computing device may be mounted on standardized frames for the mounting of multiple electronics modules. The frames may also be designed specifically for the implementations featured in this application, allowing easier access to some computing elements and being able to be pulled out in the desired direction. There can be more than one computing device in the heat exchanger tank or fixed to the heat exchanger thermal coupler. These devices are chosen to address generic or specific computing tasks. The computing device may further include fans and other typical heatsinks if the heat transferring fluid of choice is air. The racks on which the modules are mounted may feature sliders, such that the racks may be pulled out of the heat exchanger tank if maintenance or repairs need to be conducted on the computing elements.

Heat is generated when the computer device runs tasks, such as operations, calculations, or other computing tasks. The task will change depending on its higher demand, availability of devices and computing power across networks and depending on the local need for heated water.

Figure 8:
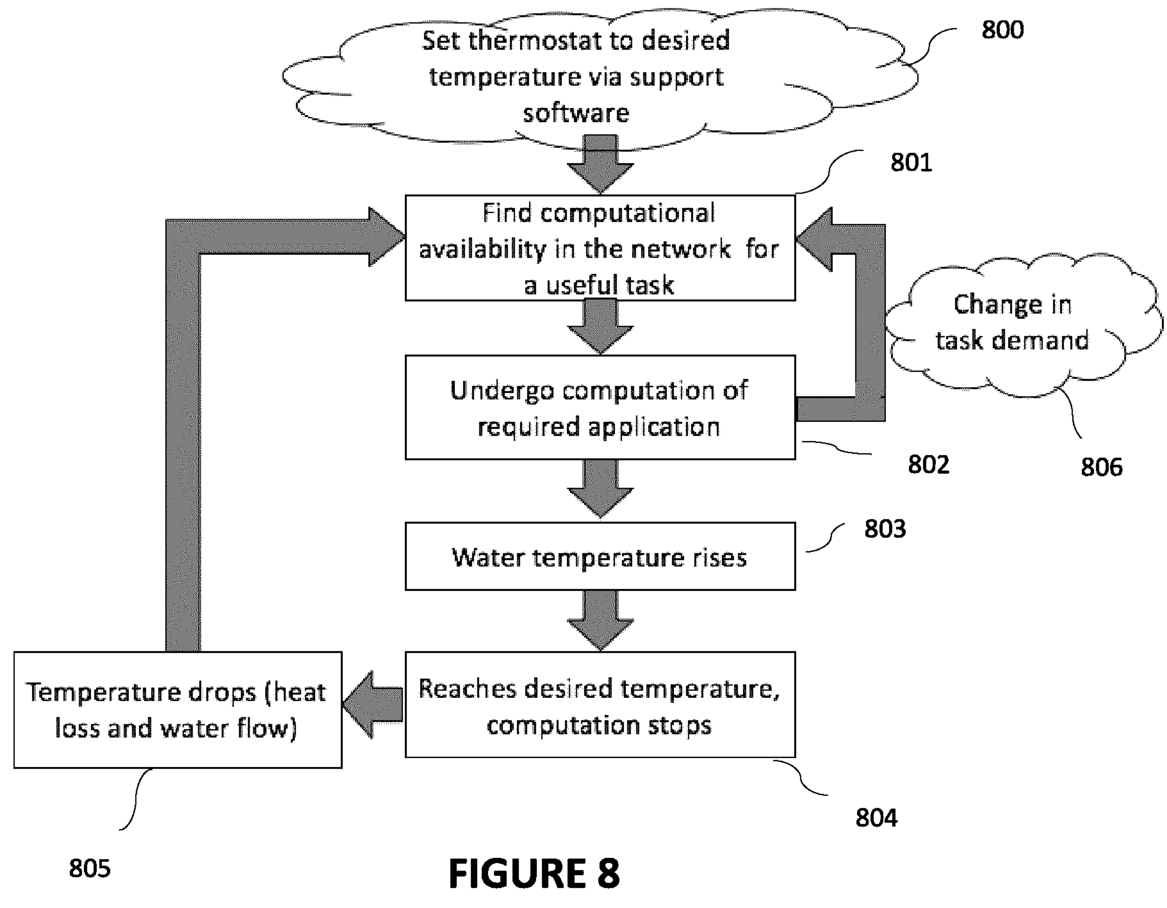
FIG. 8 is an exemplary set of steps for heating water by executing computation tasks on an exemplary computing device.

Reference is now made to FIG. 8, which presents an exemplary set of steps for the production of hot water with a computing device requesting a computational task to a network and solving the computational task.

The water tank 100 may first be set to a desired hot water temperature 800, which may be done through the software control of the system. In other embodiments, the hot water temperature may be set by a thermostat on the water tank as is usually done on current hot water tanks. If the temperature of the water inside the water tank is below the desired hot water temperature, the system may find a useful computational task available on the network at step 801.

Once the computational task is received, the computing device may execute the computation of the required application to solve the task, at step 802. From then on, if there is a change in task demand 806, either because the network removes the task from the pool of available tasks or because the computing device has completed the solving of the task, the system may find another useful computational task available on the network 801.

When the computing device executes the computational task, the temperature of the water in the water tank will rise at step 803. The system may continue to execute useful tasks until the water in the water tank reaches the desired temperature, at which time the system will stop the computations being executed by the computing device, at step 804.

The system may be continually monitoring the temperature of the water tank's temperature, or the system may monitor the temperature at given intervals. When the temperature drops, which may be due to heat loss or hot water flowing out of the water tank and being replaced by cold water, the system may find a new useful computational task to be run by the computing device, at step 805.

Although the invention has been described with reference to preferred embodiments, it is to be understood that modifications may be resorted to as will be apparent to those skilled in the art. Such modifications and variations are to be considered within the purview and scope of the present invention.

Representative, non-limiting examples of the present invention were described above in detail with reference to the attached drawing. This detailed description is merely intended to teach a person of skill in the art further details for practicing preferred aspects of the present teachings and is not intended to limit the scope of the invention. Furthermore, each of the additional features and teachings disclosed above and below may be utilized separately or in conjunction with other features and teachings.

Moreover, combinations of features and steps disclosed in the above detailed description, as well as in the experimental examples, may not be necessary to practice the invention in the broadest sense, and are instead taught merely to particularly describe representative examples of the invention. Furthermore, various features of the above-described representative examples, as well as the various independent and dependent claims below, may be combined in ways that are not specifically and explicitly enumerated in order to provide additional useful embodiments of the present teachings.

What is claimed is:

1. A water heater for receiving a computing device and for using heat produced by said computing device to heat water of in said water heater, the water heater comprising:

a water tank having a top wall, a bottom wall, at least one side wall, a height defined by a distance between the top and bottom walls and a width defined by a length of the water tank perpendicularly to said height, said water tank comprising at least one water temperature gauge, an upper electric heating element, an upper side opening for receiving and being imperviously sealable by the upper electric heating element, a lower electric heating element, a lower side opening for receiving and being imperviously sealable by the lower electric heating element, a cold water inlet through the top wall, a hot water outlet through the top wall, and a cold water pipe connected to said cold water inlet, extending downwardly in said water tank and having a cold water outlet inside the water tank below a heat exchanger tank;

the heat exchanger tank having a width smaller than the width of the water tank, having a shape able to withstand water pressure when said water tank is in operation, mounted into the top wall and imperviously sealing the top wall of said water tank, and extending downwardly inside the water tank to above the upper electric heating element so as to be immersed in said water tank when said water tank is filled with the water, thereby exchanging heat between the inside of the heat exchanger tank and an upper portion of the water tank above the upper electric heating element by conduction through the heat exchanger tank, wherein said heat exchanger tank is for containing a dielectric heat exchanging fluid maintained at normal atmospheric pressure, wherein said heat exchanger tank comprises at least one impervious connector pass-through, at least one heat exchanger temperature sensor, and a top access door for allowing access to an inside of said heat exchanger tank without draining said water tank, without depressurizing said dielectric heat exchanging fluid and without draining said dielectric heat exchanging fluid;

an insulating layer enclosing said water tank, wherein said insulating layer is adjacent to said heat exchanger tank;

wherein said heat exchanger tank is further for receiving a computing device being immersible in said heat exchanger tank through the top access door and being accessible through the top access door without draining said dielectric heat exchanging fluid, wherein said computing device comprises a processor for processing computing tasks; and a connectivity system to connect said computing device to a computer network supplying said computing tasks to said computing device such that running said computing tasks results in a heat production.

2. The water heater as defined in claim 1, further comprising a temperature controller to control said heat production from said computing device responsive to at least one of a water temperature reading from said at least one water temperature gauge and a heat exchanger temperature reading from said at least one heat exchanger temperature sensor, said temperature controller comprising at least one of: (a) a temperature relay sending to said computer network said water temperature reading and said heat exchanger temperature reading; (b) a control signal generator sending to said processor a task processing control signal; and (c) a software that maximizes the use of said computing device to warm water and minimizes the use of the upper or lower electric heating elements, in order to maximize computations and minimize energy demand.

3. The water heater as defined in claim 1, wherein said heat exchanger tank bordering said water tank further comprises a heat exchanging fluid pressure sensor and a pressure and volume controller to control a pressure and a volume of said heat exchanging fluid in said heat exchanger by controlling at least one of a temperature of said heat exchanging fluid or a volume of said heat exchange.

4. The water heater as defined in claim 1, wherein said dielectric heat exchanging liquid is mineral oil.

5. The water heater as defined in claim 1, wherein said water tank further comprises at least one water pressure sensor, said temperature controller being operable to control an internal water pressure of said water tank.

6. The water heater as defined in claim 1, further comprising a security lock system to prevent unauthorized access to said computing device.

7. The water heater as defined in claim 1, wherein said heat exchanger tank further comprises a plurality of fins on an outer surface, said outer surface being in contact with water from said water tank.

8. The water heater as defined in claim 1, wherein said water heater has a temperature controller set to a standby water temperature above about 50 degrees Celsius, and said water heater has a rate of heat loss through said insulation to the ambient at room temperature with said computing device being configured to supply heat to said water tank at a rate matching the rate of heat loss.

9. The water heater as defined in claim 1, wherein said hot water outlet further comprises a mixing valve connected to said cold water inlet, said mixing valve being controlled by said temperature controller to add cold water to said hot water outlet to obtain a desired output temperature.

10. The water heater as defined in claim 1, wherein said upper and lower electric heating elements are controlled by said temperature controller to further produce heat when said computing device is unable to produce sufficient heat to keep said hot water between a low temperature threshold and a high temperature threshold.

11. The water heater as defined in claim 1, wherein said hot water outlet from said water tank is connected to a second water tank, said water tank being used as a preheater for said second water tank.

12. A system comprising:

a computer network;

a plurality of water heaters comprising a computing device and for using heat produced from said computing device to heat water of in said water heater, each water heater from said plurality of water heater being connected to said computer network through a connectivity system, said water heater comprising:

a water tank having a top wall, a bottom wall, at least one side wall, a height defined by a distance between the top and bottom walls and a width defined by a length of the water tank perpendicularly to said height, said water tank comprising at least one water temperature gauge, an upper electric heating element, an upper side opening receiving and being imperviously sealed by the upper electric heating element, a lower electric heating element, a lower side opening receiving and being imperviously sealed by the lower electric heating element, a cold water inlet through the top wall, a hot water outlet through the top wall, and a cold water pipe connected to said cold water inlet, extending downwardly in said water tank and having a cold water outlet inside the water tank below a heat exchanger tank;

the heat exchanger tank having a width smaller than the width of the water tank having a shape able to withstand water pressure when said water tank is in operation, mounted into the top wall and imperviously sealing the top wall of said water tank, immersed in said water tank and extending downwardly inside the water tank to above the upper electric heating element, wherein said heat exchanger tank contains a dielectric heat exchanging fluid maintained at normal atmospheric pressure, wherein said heat exchanger tank comprises at least one impervious connector pass-through, at least one heat exchanger temperature sensor, and a top access door for allowing access to an inside of said heat exchanger tank without draining said water tank, without depressurizing said dielectric heat exchanging fluid and without draining said dielectric heat exchanging fluid;

an insulating layer enclosing said water tank, wherein said insulating layer is adjacent to said heat exchanger tank;

a computing device immersed in the dielectric heat exchanging fluid of said heat exchanger tank, wherein said computing device comprises a processor for processing computing tasks, the computing device being removable through the top access door and being accessible through the top access door without draining said dielectric heat exchanging fluid; and said connectivity system to connect said computing device to said computer network, said computer network supplying said computing tasks to said computing device such that running said computing tasks results in a heat production;

one or more user computing devices connected to said computer network and receiving computational results defined by a plurality of computational tasks performed by said plurality of water heaters;

a network task controller assigning computational tasks to the plurality of water heaters; and a network control interface, whereby users of the computer network submit computational tasks to be assigned to the plurality of water heaters.

13. The system as defined in claim 12, wherein each of said connectivity system is operable to send a task request to said computer network when said water heater has a heat demand.

14. The system as defined in claim 12, further comprising an external third party user connected to said computer network, wherein a result of said at least one computational task from said plurality of computational tasks is communicated directly to said external third party user.

15. The system as defined in claim 12, wherein said network task controller is operable to assign said computational tasks to a specific water heater of said plurality of water heaters.

16. The system as defined in claim 15, wherein said network task controller is in communication with a temperature controller of said specific water heater to determine control parameters.

17. The system as defined in claim 15, wherein said network task controller is operable to assign said computational tasks based on availability determined by a demand in heated water.

18. The system as defined in claim 12, wherein said network task controller is operable to predict a demand in heated water through a predictive algorithm.

19. The system as defined in claim 18, wherein said predictive algorithm uses at least one of a water heating data internal to the household of a water heater and a data set of data external to said household.

* * * * *